US010074762B2

(12) United States Patent
Ishii et al.

(10) Patent No.: US 10,074,762 B2
(45) Date of Patent: Sep. 11, 2018

(54) SOLAR CELL MODULE AND SOLAR CELL MODULE PRODUCTION METHOD (71) Applicant: Panasonic Intellectual Property Management Co., Ltd., Osaka-shi, Osaka (JP)

(72) Inventors: Yousuke Ishii, Osaka (JP); Isao Hasegawa, Osaka (JP)

(73) Assignee: Panasonic Intellectual Property Management Co., Ltd., Osaka-shi (JP)

( * ) Notice: Subject to any disclaimer, the term of this patent is extended or adjusted under 35 U.S.C. 154(b) by 0 days.

(21) Appl. No.: 15/421,566

(22) Filed: Feb. 1, 2017

(65) Prior Publication Data
US 2017/0141253 A1 May 18, 2017

Related U.S. Application Data (63) Continuation of application No. PCT/JP2015/004264, filed on Aug. 25, 2015.

(30) Foreign Application Priority Data

Aug. 28, 2014 (JP) ................................. 2014-174185

(51) Int. Cl.
H01L 31/05 (2014.01)
H01L 31/0475 (2014.01)
(Continued)

(52) U.S. Cl.
CPC .... H01L 31/0508 (2013.01); H01L 31/02013 (2013.01); H01L 31/0475 (2014.12);
(Continued)

(58) Field of Classification Search
CPC ............. H01L 31/0508; H01L 31/0475; H01L 31/02013; H01L 31/056; H01L 31/02327; H01L 31/0504
See application file for complete search history.

(56) References Cited

U.S. PATENT DOCUMENTS 6,410,843 B1 6/2002 Kishi et al.
2012/0073621 A1* 3/2012 Hashimoto ..... H01L 31/022433
136/244
(Continued)

FOREIGN PATENT DOCUMENTS

CN 201036230 Y 3/2008
CN 102369646 A 3/2012
(Continued)

OTHER PUBLICATIONS

Extended (supplementary) European Search Report dated Jul. 19, 2017, issued in counterpart European Application No. 15835750.9. (8 pages).
(Continued)

*Primary Examiner* — Matthew T Martin
(74) *Attorney, Agent, or Firm* — Westerman, Hattori, Daniels & Adrian, LLP (57) ABSTRACT This solar module has: a base member that is curved in the vertical direction and the horizontal direction; strings each constituted from a plurality of solar cells and first wiring members connecting adjacent solar cells in the vertical direction, wherein a plurality of the strings are arranged side by side on the base member; and a string group constituted from a plurality of the strings and second wiring members, which are disposed at both sides in the vertical direction of the strings and connected to the first wiring members, thereby connecting adjacent strings to one another in the horizontal direction. The string group is divided into at least two blocks that are side by side in the vertical direction. Second wiring members are disposed adjacent in the horizontal direction, or second wiring members are disposed adjacent in the vertical direction between the blocks, and are secured to one another.

6 Claims, 7 Drawing Sheets (51) Int. Cl.
  *H01L 31/02* (2006.01)
  *H01L 31/056* (2014.01)
  *H01L 31/0232* (2014.01)

(52) U.S. Cl.
  CPC ...... *H01L 31/056* (2014.12); *H01L 31/02327* (2013.01); *H01L 31/0504* (2013.01)

(56) References Cited

U.S. PATENT DOCUMENTS

| | | |
|---|---|---|
| 2012/0133322 A1 | 5/2012 | Walsh et al. |
| 2014/0130848 A1 | 5/2014 | Takechi et al. |
| 2014/0312700 A1 | 10/2014 | Catthoor et al. |
| 2015/0303337 A1 | 10/2015 | Ishii et al. |

FOREIGN PATENT DOCUMENTS

| | | |
|---|---|---|
| CN | 202855765 U | 4/2013 |
| JP | 3-204979 A | 9/1991 |
| JP | 2001-148500 A | 5/2001 |
| JP | 2010-129653 A | 6/2010 |
| JP | 2011-151334 A | 8/2011 |
| JP | 2012-256728 A | 12/2012 |
| JP | 2014-96511 A | 5/2014 |
| JP | 2014-027155 A | 6/2014 |
| WO | 2013/016010 A1 | 1/2013 |
| WO | 2013/060564 A2 | 5/2013 |
| WO | 2014/109281 A1 | 7/2014 |

OTHER PUBLICATIONS

International Search Report dated Oct. 13, 2015, issued in counterpart application No. PCT/JP2015/004264, w/English translation. (5 pages).

Office Action dated Sep. 30, 2017, issued in counterpart Chinese application No. 201580046581.5, with English translation. (11 pages).

Office Action dated May 9, 2018, issued in counterpart Chinese Application No. 201580046581.5, with English translation of Search Report. (8 pages).

\* cited by examiner

SOLAR CELL MODULE AND SOLAR CELL MODULE PRODUCTION METHOD

CROSS-REFERENCE TO RELATED APPLICATIONS

The present application is a continuation under 35 U.S.C. § 120 of PCT/JP2015/004264, filed Aug. 25, 2015, which is incorporated herein by reference and which claimed priority to Japanese Patent Application No. 2014-174185 filed on Aug. 28, 2014. The present application likewise claims priority under 35 U.S.C. § 119 to Japanese Patent Application No. 2014-174185 filed on Aug. 28, 2014, the entire content of which is also incorporated herein by reference.

TECHNICAL FIELD

The present disclosure relates to a solar cell module and a method of manufacturing a solar cell module.

BACKGROUND

A solar cell module is known in which a group of strings of solar cells are placed over a substrate having a three-dimensional curvature (hereinafter referred to as "curved substrate") (for example, refer to Patent Literature 1). As described in Patent Literature 1, a solar cell module which is three-dimensionally curved is desirably manufactured, from the viewpoint of productivity or the like, by placing the group of strings over the curved substrate after the group of strings have been manufactured on a flat surface.

CITATION LIST

Patent Literature

Patent Literature 1: JP 2014-96511 A

SUMMARY

When the group of strings are placed over the curved substrate, there is a possibility, for example, that a spacing between strings will be narrowed at some of the group of strings, the solar cells will contact each other, and consequently, short-circuiting, cell cracking or the like will occur. In addition, in the group of strings placed over the curved substrate, because a large load tends to be applied on a wiring member, it is desired to reduce the load and to thereby improve the reliability.

According to one aspect of the present disclosure, there is provided a solar cell module comprising: a substrate which is curved in a longitudinal direction and in a lateral direction; a plurality of strings each comprising a plurality of solar cells and first wiring members that connect adjacent solar cells to each other in the longitudinal direction, and placed over the substrate, aligned in the lateral direction; and a group of strings comprising a plurality of the strings and second wiring members that are placed on sides of the string in the longitudinal direction, that are connected to the first wiring members, and that connect adjacent strings to each other in the lateral direction, wherein the group of strings is divided into at least two blocks aligned in the longitudinal direction, and at least two of the second wiring members of the strings placed adjacent to each other in the lateral direction are fixed to each other and/or at least two of the second wiring members placed adjacent to each other in the longitudinal direction between the blocks are fixed to each other.

According to another aspect of the present disclosure, there is provided a method of manufacturing a solar cell module, comprising: connecting adjacent solar cells to each other in a longitudinal direction with first wiring members to form a plurality of strings in each of which a plurality of solar cells are arranged in one line; placing second wiring members on sides of the string in the longitudinal direction and connecting the second wiring members to the first wiring members, to connect adjacent strings in a lateral direction and to form a group of strings which is divided into at least two blocks aligned in the longitudinal direction; and after fixing to each other at least two of the second wiring members of the strings placed adjacent to each other in the lateral direction and/or at least two of the second wiring members placed adjacent to each other in the longitudinal direction between the blocks, placing the group of strings over a substrate which is curved in the longitudinal direction and in the lateral direction, or, after placing the group of strings over the substrate which is curved in the longitudinal direction and in the lateral direction, fixing to each other at least two of the second wiring members of the strings placed adjacent to each other in the lateral direction and/or at least two of the second wiring members placed adjacent to each other in the longitudinal direction between the blocks.

According to an aspect of the present disclosure, in a solar cell module which is three-dimensionally curved, a superior arrangement state of the solar cells can be obtained without occurrence of short-circuiting, cell cracking, or the like due to contact of the solar cells. In addition, load applied to the wiring member can be reduced and the reliability can be consequently improved.

DESCRIPTION OF EMBODIMENTS

Examples of embodiments of the present disclosure will now be described in detail with reference to the drawings.

The drawings referred to in the embodiments are schematically drawn, and the size, ratio, or the like of the constituting elements shown in the drawings may differ from the actual structure. The specific size, ratio, or the like should be determined in consideration of the following description.

In the present specification, a term "longitudinal direction" and a term "lateral direction" are used as terms indicating directions. The longitudinal direction refers to a direction along which a plurality of blocks of a group of string are arranged. The lateral direction refers to a direction orthogonal to the longitudinal direction, and is a direction along which the strings of the group of strings are arranged. Further, a description of "providing a second member over a first member" is not intended to mean only the case where the first and second members are provided in direct contact with each other, unless otherwise specified. That is, such a description includes a case where another member exists between the first and second members.

In the following, a surface in a solar cell module where the solar light is primarily incident (exceeding 50% and up to 100%) is referred to as a "light receiving surface", and a surface opposite to the light receiving surface is referred to as a "back surface". The terms light receiving surface and back surface are also used for constituent elements of the solar cell or the like.

First Embodiment

Figure 1:
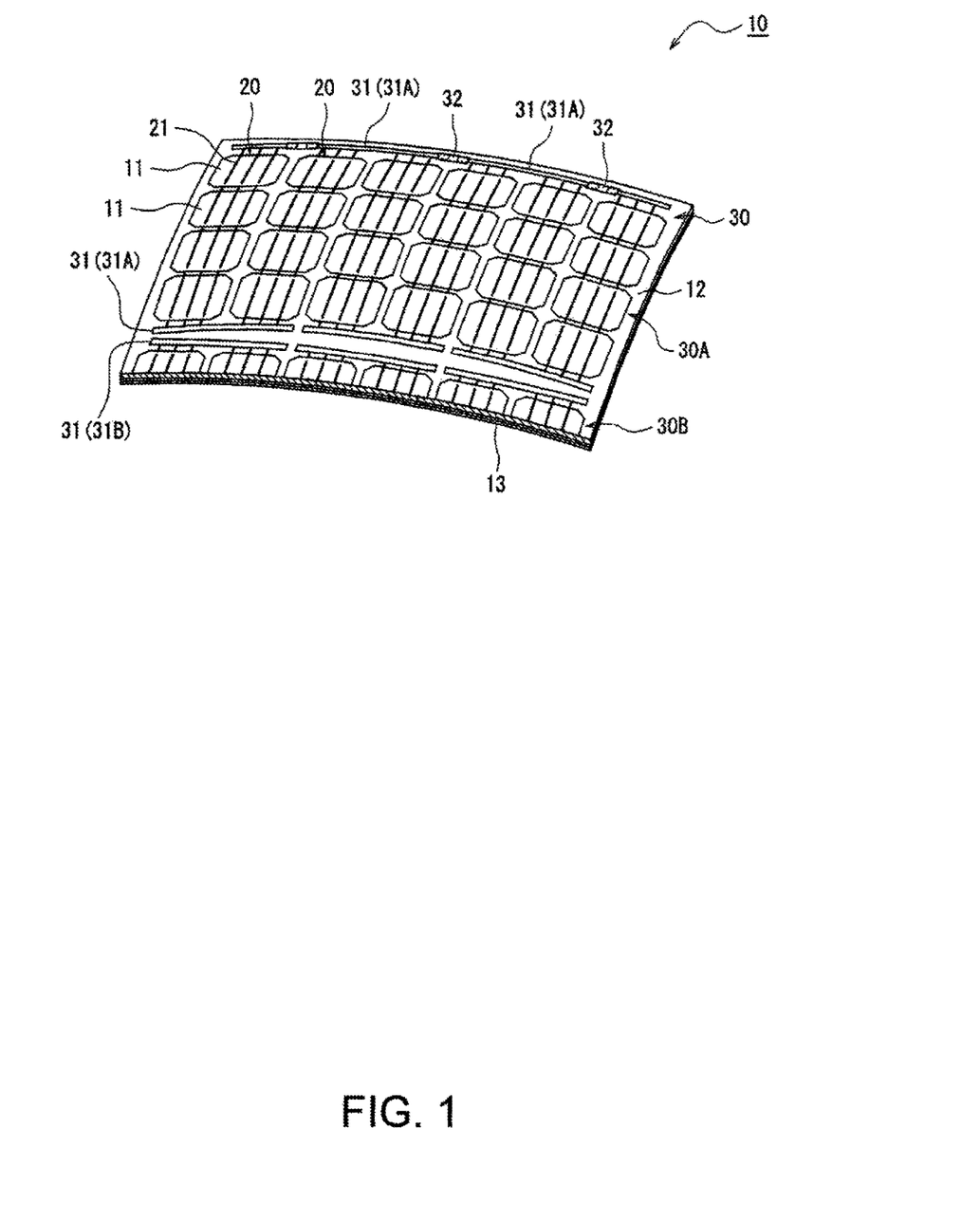
FIG. 1 is a perspective diagram of a solar cell module according to a first embodiment of the present disclosure, viewed from a light receiving surface side (also showing a cross section in the lateral direction of the solar cell module).
Figure 2:
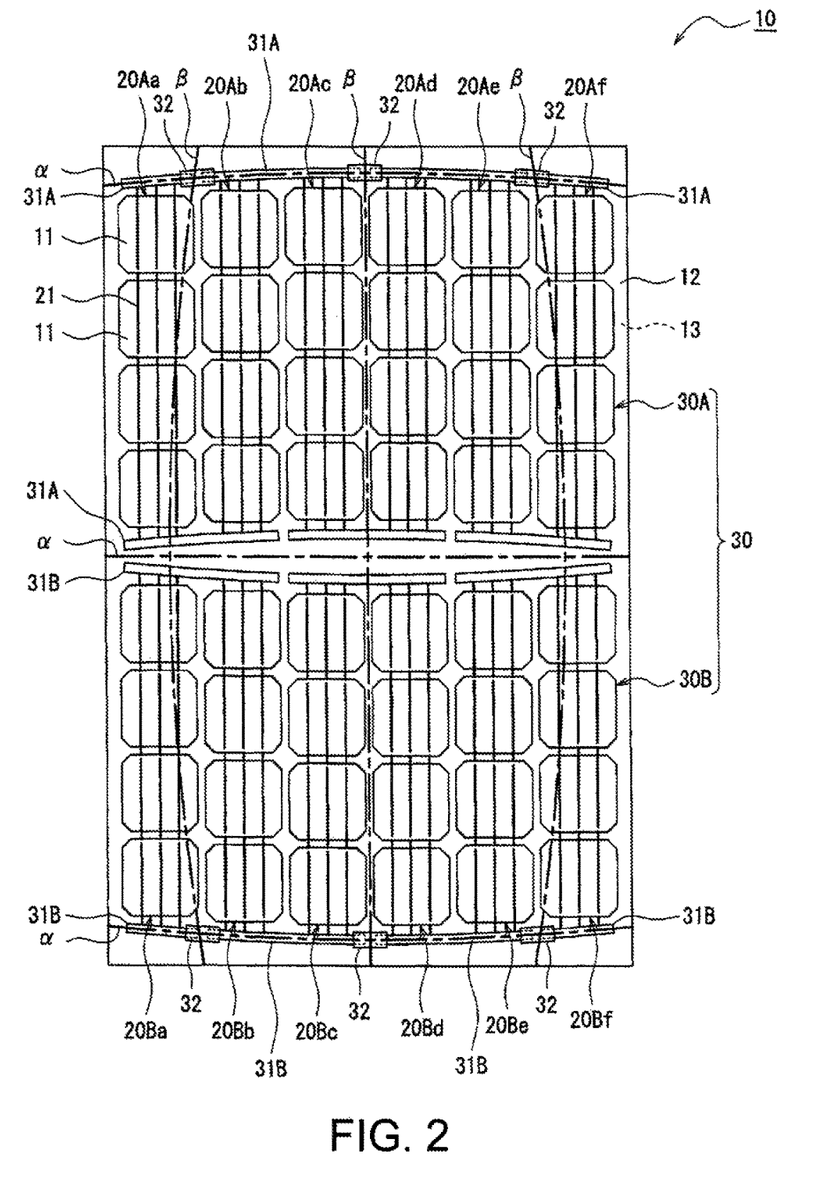
FIG. 2 is a plan view of the solar cell module according to the first embodiment of the present disclosure, viewed from the light receiving surface side.
Figure 3:
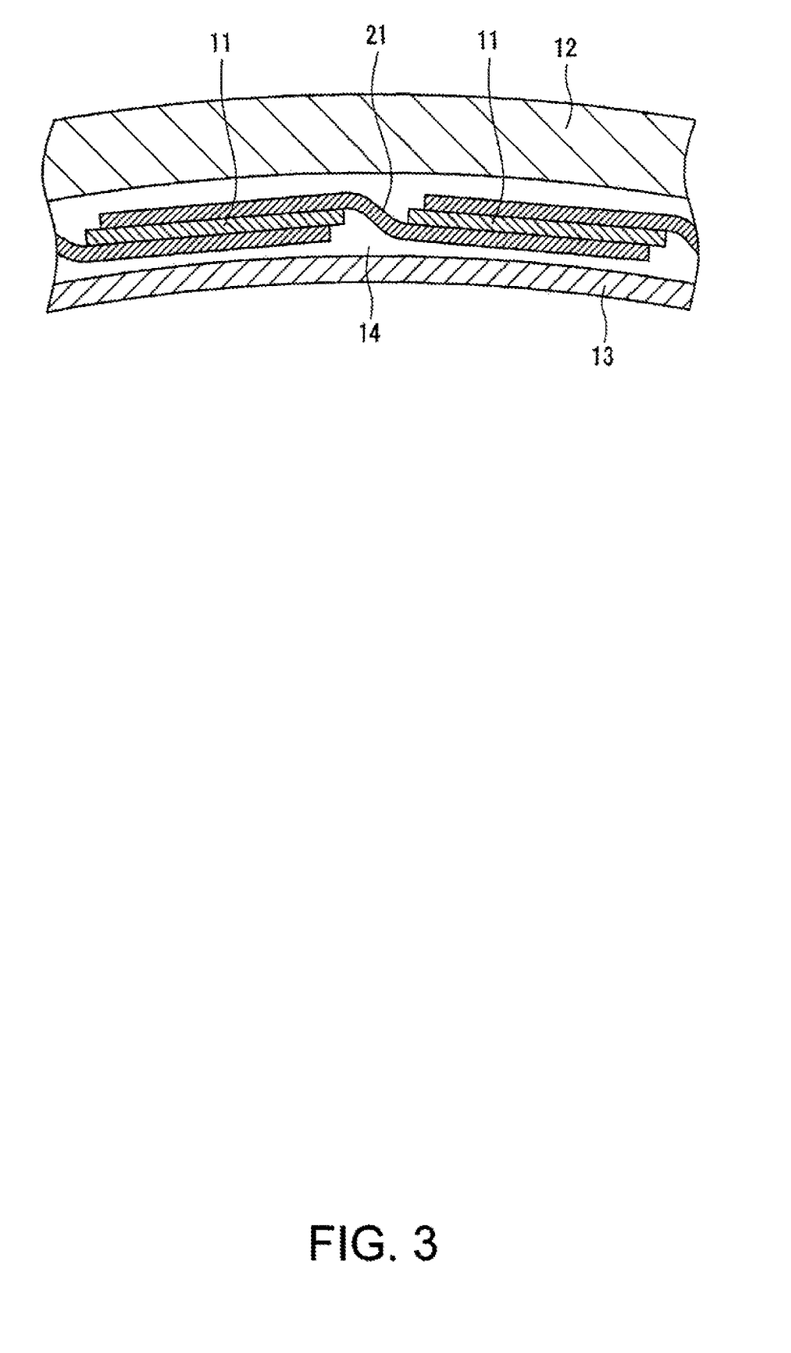
FIG. 3 is a diagram showing a part of a cross section, in a longitudinal direction, of the solar cell module according to the first embodiment of the present disclosure.

A solar cell module 10 according to a first embodiment of the present disclosure will now be described in detail with reference to FIGS. 1~4. FIG. 1 and FIG. 2 are respectively a perspective view and a plan view of the solar cell module 10, viewed from a light receiving surface side. FIG. 3 is a diagram showing a part of a cross section in a longitudinal direction of the solar cell module 10.

As shown in FIGS. 1~3, the solar cell module 10 comprises a plurality of solar cells 11, a first protection component 12 provided on a side of a light receiving surface of the solar cell 11, and a second protection component 13 provided on a side of a back surface of the solar cell 11. The plurality of solar cells 11 are sandwiched and held between the first protection component 12 and the second protection component 13, and are sealed by an encapsulant 14 (refer to FIG. 3) filled between the protection components.

The solar cell module 10 comprises a substrate which is curved in a longitudinal direction and in a lateral direction, and has a three-dimensionally curved shape. In the present embodiment, the first protection component 12 is the substrate which is curved in the longitudinal direction and in the lateral direction and which has a three-dimensional curvature. As will be described later in detail, the second protection component 13, the encapsulant 14, and a group of strings 30 (refer to FIGS. 1 and 2) are placed over the first protection component 12, to obtain the solar cell module 10 which is three-dimensionally curved.

The solar cell module 10 has strings 20 (refer to FIGS. 1 and 2) in each of which a plurality of the solar cells 11 are arranged in one line. The string 20 comprises a plurality of solar cells 11, and first wiring members 21 that connect adjacent solar cells 11 to each other in the longitudinal direction. A plurality of the strings 20 are placed over the first protection component 12, aligned in the lateral direction. The first wiring member 21 is bent, for example, in a thickness direction of the module in a region between adjacent solar cells 11, and is attached using an adhesive or the like to an electrode on the light receiving surface side of one solar cell 11 and to an electrode on the back surface side of the other solar cell 11 (refer to FIG. 3).

The solar cell module 10 comprises a group of strings 30 in which a plurality of the strings 20 are aligned in the lateral direction. The group of strings 30 comprises a plurality of the strings 20, and second wiring members 31 that are placed on sides of the string 20 in the longitudinal direction, that are connected to the first wiring members 21, and that connect adjacent strings 20 to each other in the lateral direction. Some of the second wiring members 31 are connected to a terminal portion (not shown) provided on the back side of the second protection component 13, for example.

In the present embodiment, the group of strings 30 is divided into two blocks 30A and 30B aligned in the longitudinal direction, with 6 rows of strings 20 in each block, and a total of 12 rows of strings 20. In the following, the strings 20 of the block 30A are referred to, from the left of FIG. 2, as strings 20Aa, 20Ab, 20Ac, 20Ad, 20Ae, and 20Af. Similarly, the strings 20 of the block 30B are referred to as strings 20Ba, 20Bb, 20Bc, 20Bd, 20Be, and 20Bf. The 6 rows of strings 20 of the block 30A and the 6 rows of the string 20 of the block 30B are placed in an aligned manner in the longitudinal direction. For example, the strings 20Aa and 20Ba are aligned in the longitudinal direction.

The solar cell 11 comprises a photoelectric conversion unit which produces carriers upon receiving solar light. The photoelectric conversion unit has, as electrodes for collecting the produced carriers, a light receiving surface electrode formed over the light receiving surface of the photoelectric conversion unit and a back surface electrode formed over the back surface, for example (both of which are not shown in the figures). The wiring members 21 are connected to the electrodes. However, the structure of the solar cell 11 is not limited to this structure, and the structure may be, for example, a structure in which the electrode is formed only over the back surface of the photoelectric conversion unit. Desirably, the back surface electrode is formed in a larger area than the light receiving surface electrode, and a surface having a larger electrode area (or a surface on which the electrodes are formed) may be considered as the back surface of the solar cell 11.

The photoelectric conversion unit comprises a semiconductor substrate made of, for example, crystalline silicon (c-Si), gallium arsenide (GaAs), indium phosphide (InP), or the like, an amorphous semiconductor layer formed over the semiconductor substrate; and a transparent conductive layer formed over the amorphous semiconductor layer. As a specific example, a structure may be employed in which an i-type amorphous silicon layer, a p-type amorphous silicon layer, and a transparent conductive layer are sequentially formed over one surface of an n-type monocrystalline silicon substrate, and an i-type amorphous silicon layer, an n-type amorphous silicon layer, and a transparent conductive layer are sequentially formed over the other surface. The transparent conductive layer is desirably formed from a transparent conductive oxide in which a metal oxide such as indium oxide ($In_2O_3$) and zinc oxide (ZnO) is doped with Sn, Sb, or the like.

For the first protection component 12 and the second protection component 13, for example, a glass substrate, a resin substrate, a resin film, or the like may be employed. For the first protection component 12, a member having a light transmissive characteristic is used, and from the viewpoint of heat resistivity and endurance, a glass substrate is desirably used. A thickness of the glass substrate is, for example, about 2~6 mm. For the second protection component 13, a transparent member may be used or a non-transparent member may be used. For the second protection component 13, for example, a resin film is used. A thickness of the resin film is, for example, about 50~300 μm.

In the present embodiment, as described above, as the substrate which is curved in the longitudinal direction and in the lateral direction, the first protection component 12 is used. The first protection component 12 is not particularly limited so long as the component has a curved surface which is curved in the longitudinal direction and in the lateral direction, and has, for example, a curved surface with a three-dimensional curvature such as part of a spherical surface. The curvature of the first protection component 12 is not particularly limited, and may be a constant over the entire region of the first protection component 12 or different at a part of the regions. In the following, a structure is described in which the curvature of the first protection component 12 is approximately constant. The first protection component 12 is, for example, a transparent glass substrate which is three-dimensionally curved with an approximately constant curvature, and has an approximately rectangular shape in the plan view. In the present specification "approximately" is intended to include, for example, in the case of "approximately constant", cases of completely constant and also cases of substantially constant.

The encapsulant 14 has a function to fill a gap between the solar cell 11 and the protection components, to seal the solar cell 11. The encapsulant 14 desirably has, as a primary constituent, a resin that can be applied in a lamination process to be described below. As the resin, ethylene vinyl acetate copolymer (EVA), polyvinylbutyral (PVB), or the like can be exemplified. The encapsulant 14 may include various additives such as an oxidation prevention agent, a flame resisting agent, an ultraviolet absorption agent, or the like, and the encapsulant 14 placed at the back surface side of the solar cell 11 may contain pigments such as titanium oxide.

As shown in FIGS. 1 and 2, the group of strings 30 is divided into at least two blocks aligned in the longitudinal direction. At least two of the second wiring members 31 of the strings 20 placed adjacent to each other in the lateral direction are fixed to each other and/or at least two of the second wiring members 31 placed adjacent to each other in the longitudinal direction between the blocks are fixed to each other.

The group of strings 30 is desirably divided into two blocks 30A and 30B. In the present embodiment, the group of strings 30 is divided into two at a central portion in the longitudinal direction, and numbers of solar cells 11 forming the strings 20 of the blocks 30A and 30B are equal to each other (four in the example configuration shown in FIG. 2). As the number of cells in the string 20 is increased, that is, as the string 20 becomes longer, the placement becomes more easily disturbed. Thus, in the solar cell module 10, the string 20 is shortened by the division of the group of strings 30, to suppress the disturbance in the placement of the strings 20. A length of the string 20 in each block may be suitably changed according to the curvature of the substrate or the like, and may be set, for example, to be shorter as the curvature of the substrate becomes larger.

Second wiring members 31 are preferably provided on both sides in the longitudinal directions of the blocks 30A and 30B. In the present embodiment, a plurality of second wiring members 31A are placed on the sides of the block 30A in the longitudinal direction, and a plurality of second wiring members 31B are placed on the sides of the block 30B in the longitudinal direction. In a region between the blocks 30A and 30B (boundary position), the second wiring members 31A and 31B are placed adjacent to each other in the longitudinal direction. In addition, the blocks 30A and 30B are electrically connected to each other by, for example, a cable provided on the back side of the second protection component 13, or the like.

The string 20 is desirably formed by connecting two adjacent solar cells 11 by a plurality (for example, three) of first wiring members 21 aligned in the lateral direction. The plurality of first wiring members 21 extend from regions above solar cells 11 positioned at the ends of the row of each string 20 in the sides in the longitudinal direction, and are connected to the second wiring members 31.

In the example configuration shown in FIG. 2, four second wiring members 31A are placed adjacent in the lateral direction to a side of one end of the block 30A in the longitudinal direction (opposite side from the block 30B), and two of the four second wiring members 31A connect two adjacent strings 20 (the block 30B has a similar structure). Specifically, strings 20Ab and 20Ac, and strings 20Ad and 20Ae are connected to each other by second wiring members 31A placed at the side of the one end of the block 30A in the longitudinal direction. The remaining two second wiring members 31A are connected only to the strings 20Aa and 20Af, respectively. For example, the four second wiring members 31A are connected to the terminal portion.

On the side of the other end of the block 30A in the longitudinal direction (on the side of the block 30B), three second wiring members 31A are placed adjacent to each other in the lateral direction, and the wiring members connect two adjacent strings 20. Specifically, the strings 20Aa and 20Ab, the strings 20Ac and 20Ad, and the strings 20Ae and 20Af are connected to each other respectively by the second wiring members 31A placed at the side of the one end of the block 30A in the longitudinal direction.

In the group of strings 30, the second wiring members 31A placed adjacent to each other in the lateral direction and the second wiring members 31B placed adjacent to each other in the lateral direction are respectively fixed to each other. Desirably, two adjacent second wiring members 31A are fixed to each other only at the side of the one end of the block 30A in the longitudinal direction, and the second wiring members 31A placed at the side of the other end of the block 30A in the lateral direction are not fixed to each other (the structure is similar for the block 30B). In other words, preferably, the second wiring members 31 placed adjacent to each other in the lateral direction are fixed to each other at both sides in the longitudinal direction of the group of strings 30. For the fixation of the second wiring members 31A and 31B, for example, an adhesion tape 32 is used. In the present embodiment, the adhesion tape 32 is provided respectively over two second wiring members 31A placed adjacent to each other in the lateral direction, between the strings 20Aa and 20Ab, between the strings 20Ac and 20Ad, and between the strings 20Ae and 20Af.

The second wiring members 31 are desirably fixed by the adhesion tape 32 as described above. A material of the adhesion tape 32 is not particularly limited so long as the material has an insulating characteristic and has a superior contact characteristic with the second wiring member 31. The adhesion tape 32 is desirably thinner than a thickness of the second wiring member 31, and is adhered to one surface or both surfaces of the second wiring member 31. For fixation of the second wiring members 31 to each other, an adhesive, a clip, or the like may alternatively be used, but from the viewpoint of the productivity and design, the use of the adhesion tape 32 is desirable.

The second wiring members 31A and 31B fixed by the adhesion tape 32 are desirably placed along the curved surface of the first protection component 12, for example, along a virtual curve α having a constant curvature along the curved surface of the first protection component 12. With such a configuration, for example, distortions of the second wiring members 31A and 31B can be reduced, and the load applied thereto can be reduced. In addition, with the fixation of the second wiring members 31A and 31B, movement of the string 20 can be constrained for a certain degree, and disturbance of the placement of the string 20 when the group of strings 30 is placed over the first protection component 12 can be suppressed. When the second wiring members 31A and 31B are placed along the virtual curve α, the string 20, in particular, the string 20 positioned on the sides of the group of strings 30 in the lateral direction, tends to more easily move toward the inner side. However, with the division of the group of strings 30, the effect of the movement can be suppressed. In other words, the narrowing of spacing between the strings 20 at a part thereof and consequent contact of the solar cells 11 can be prevented.

A length of the group of strings 30 in the longitudinal direction is desirably set longer from the ends in the lateral direction toward the central portion in the lateral direction. In the present embodiment, of the strings 20 of the block 30A, the strings 20Ac and 20Ad placed at the central portion of the block in the lateral direction protrudes the most on the side of one end in the longitudinal direction. The degree of protrusion of the string 20 becomes larger from the ends of the block 30A in the lateral direction toward the central portion in the lateral direction. Meanwhile, in the block 30B, the strings 20Bc and 20Bd placed at the central portion in the lateral direction protrude the most toward the side of the other end in the longitudinal direction, and the degree of protrusion of the strings 20 becomes larger from the ends in the lateral direction toward the central portion in the lateral direction.

In other words, the strings 20 of the blocks 30A and 30B aligned in the longitudinal direction are placed to become further away from each other from the ends of the group of strings 30 in the lateral direction toward the central portion in the lateral direction. The spacing between the adjacent blocks 30A and 30B becomes maximum at the central portion of the group of strings 30 in the lateral direction, for example, between the strings 20Ac and 20Ad and the strings 20Bc and 20Bd.

The solar cell module 10 having the above-described structure can be manufactured by laminating the group of strings 30 using resin sheets forming the first protection component 12, the second protection component 13, and the encapsulant 14. In a laminating device, the first protection component 12, a first resin sheet forming the encapsulant 14, the group of strings 30, a second resin sheet forming the encapsulant 14, and the second protection component 13 are layered in sequence over a heater. From the viewpoint of productivity or the like, the group of strings 30 is placed over the first protection component 12 after being manufactured on a flat surface, as will be described later. The layered structure is heated, for example, to a temperature at which the resin sheet forming the encapsulant 14 is softened under a vacuum state. Then, the heating is continued while the constituent members are pressed toward the heater side under an atmospheric pressure, to laminate the members, and to consequently obtain the solar cell module 10.

Figure 4:
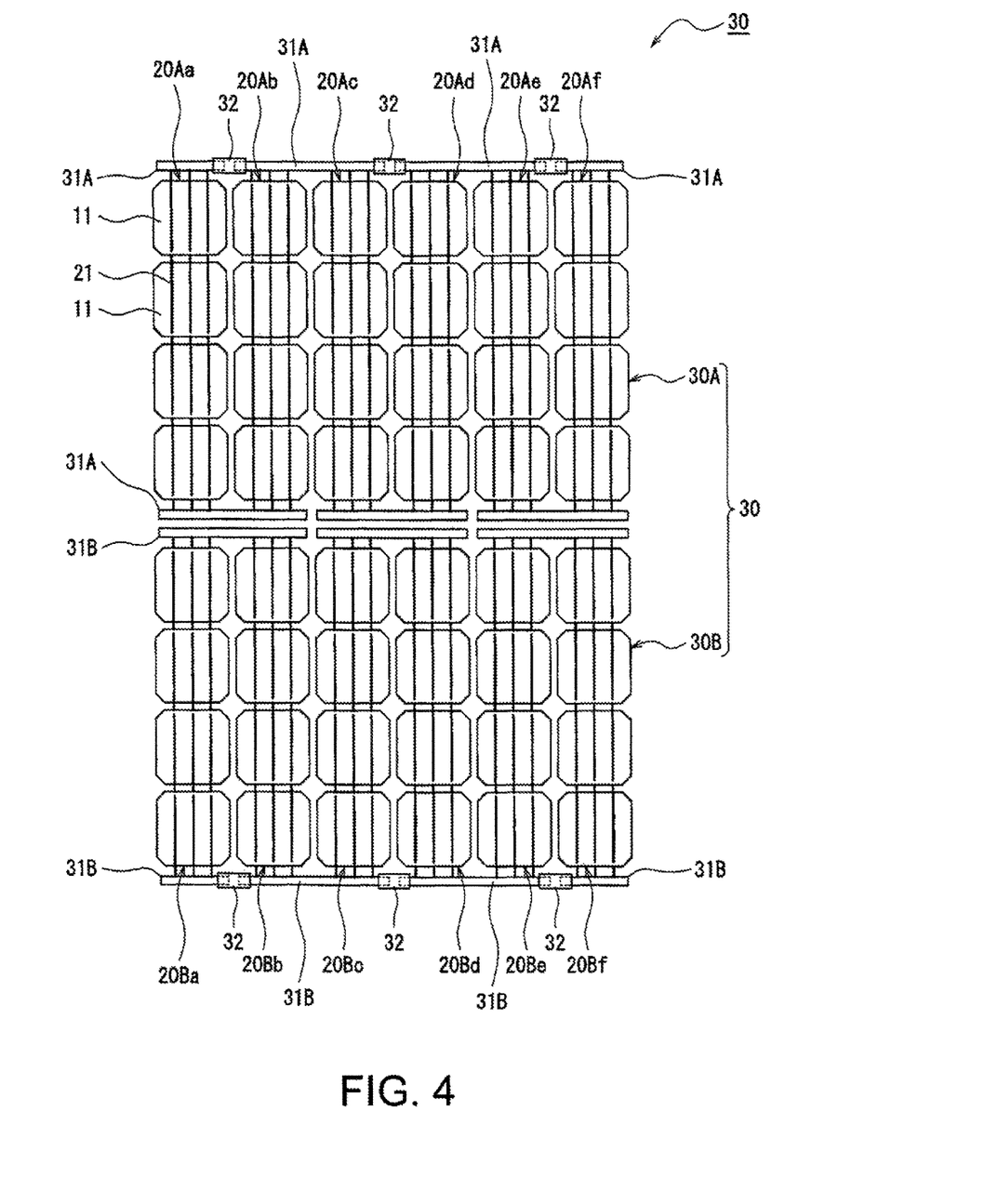
FIG. 4 is a diagram for explaining a method of manufacturing the solar cell module according to the first embodiment of the present disclosure.

FIG. 4 shows the group of strings 30 manufactured on a flat surface (and before being placed over the substrate).

As shown in FIG. 4, the group of strings 30 is manufactured by forming the string 20 on a flat surface by connecting adjacent solar cells 11 in the longitudinal direction with the first wiring members 21, and connecting the second wiring member 31 to the first wiring member 21 of each string. In the present embodiment, the second wiring members 31 are placed on the sides of the string 20 in the longitudinal direction to connect adjacent strings 20 in the lateral direction and to form the group of strings 30 divided into two blocks 30A and 30B aligned in the longitudinal direction. In this case, the second wiring members 31A and 31B extend straight in the lateral direction, and the spacing between the locks 30A and 30B is approximately constant.

Next, at least the second wiring members 31 placed adjacent to each other in the lateral direction or the second wiring members 31 placed adjacent to each other in the longitudinal direction between the blocks are fixed to each other using, for example the adhesion tape 32. In the present embodiment, the adhesion tape 32 is adhered over two adjacent second wiring members 31A only at one end side of the block 30A in the longitudinal direction, to fix the wiring members. In the block 30B, the adhesion tape 32 is adhered over two adjacent second wiring members 31B only at the other end side in the longitudinal direction.

Next, the group of strings 30 to which the adhesion tape 32 is adhered is placed over the first protection component 12, and is laminated along with the constituting members. When the group of strings 30 is placed over the first protection component 12, the second wiring member 31 fixed by the adhesion tape 32 is placed along the curved surface of the first protection component 12, and a length of the group of strings 30 in the longitudinal direction becomes longer from the ends in the lateral direction toward the central portion in the lateral direction. In this manner, the solar cell module 10 having the above-described structure is obtained. Alternatively, the second wiring members 31 may be fixed by the adhesion tape 32 after the group of strings 30 has been placed over the first protection component 12.

As described, in the solar cell module 10, the second wiring members 31 are fixed by the adhesion tape 32, and the group of strings 30 is divided into the blocks 30A and 30B. With this configuration, it is possible to suppress disturbance in the placement of the strings 20 when the group of strings 30 is placed over the first protection component 12, and to prevent occurrence of short-circuiting, cell cracking, or the like due to contact of solar cells 11. Further, in addition to the reduction of the load on the second wiring member 31, the load applied on the first wiring member 21 can also be reduced, and, for example, a superior outer appearance (superior arrangement state of the solar cells 11) and a high reliability can be achieved.

Second Embodiment

A solar cell module 50 according to a second embodiment of the present disclosure will now be described in detail with reference to FIGS. 5 and 6. In the following, constituent elements similar to those in the above-described embodiment are assigned the same reference numerals and will not be described again.

Figure 5:
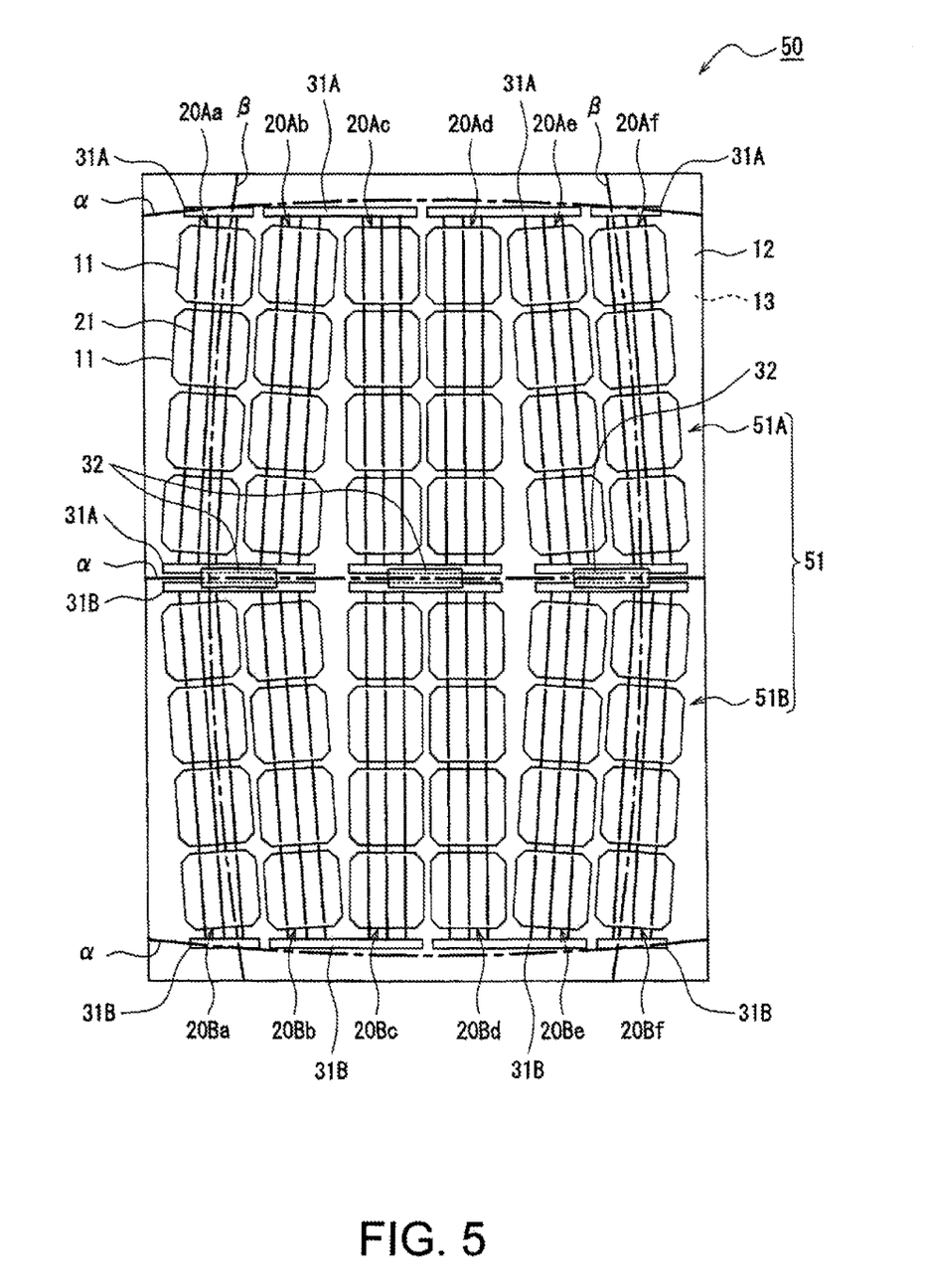
FIG. 5 is a plan view of a solar cell module according to a second embodiment of the present disclosure, viewed from a light receiving surface side.

FIG. 5 is a plan view of the solar cell module 50 viewed from a light receiving surface side.

As shown in FIG. 5, the solar cell module 50 differs from the solar cell module 10 in that the second wiring members 31A and 31B placed adjacent to each other in the longitudinal direction between blocks 51A and 51B are fixed to each other. Further, the solar cell module 50 differs from the solar cell module 10 in that the second wiring members 31A placed adjacent to each other in the lateral direction and the second wiring members 31B placed adjacent to each other in the lateral direction are not connected. The second wiring members 31A and the second wiring members 31B are desirably fixed using the adhesion tape 32, similar to the solar cell module 10.

In the present embodiment, the strings 20 of each block are connected in the longitudinal direction via the second wiring members 31A and 31B and the adhesion tape 32 to form a pair of two rows of strings. For example, the second wiring member 31A connecting the strings 20Aa and 20Ab and the second wiring member 31B connecting the strings 20Ba and 20Bb are fixed to each other using the adhesion tape 32.

A length of a group of strings 51 in the lateral direction desirably becomes longer from ends in the longitudinal direction toward a boundary position between the blocks 51A and 51B. In the present embodiment, the group of strings 51 is divided into two at the central portion in the longitudinal direction, and the numbers of solar cells 11 in the strings 20 of the blocks 51A and 51B are identical to each other. In other words, in the group of strings 51, the central portion in the longitudinal direction protrudes on both sides in the lateral direction, and the length in the lateral direction becomes longer from the ends in the longitudinal direction toward the central portion in the longitudinal direction.

The strings 20 placed on the sides of the group of strings 51 in the lateral direction are placed along a virtual curve β having a constant curvature along the curved surface of the first protection component 12. That is, on the sides of the group of strings 51 in the lateral direction, the strings 20 are formed in such a manner that the strings protrude on sides opposite to each other.

The group of strings 51 is formed such that a gap (spacing) between the adjacent strings 20 is widened from ends of the group of strings 51 in the longitudinal direction toward the boundary position of each block (central portion of the group of strings 51 in the longitudinal direction). More specifically, the spacing between the pairs of the strings connected in the longitudinal direction via the second wiring members 31A and 31B and the adhesion tape 32 becomes widened toward the central portion of the group of strings 51 in the longitudinal direction.

Figure 6:
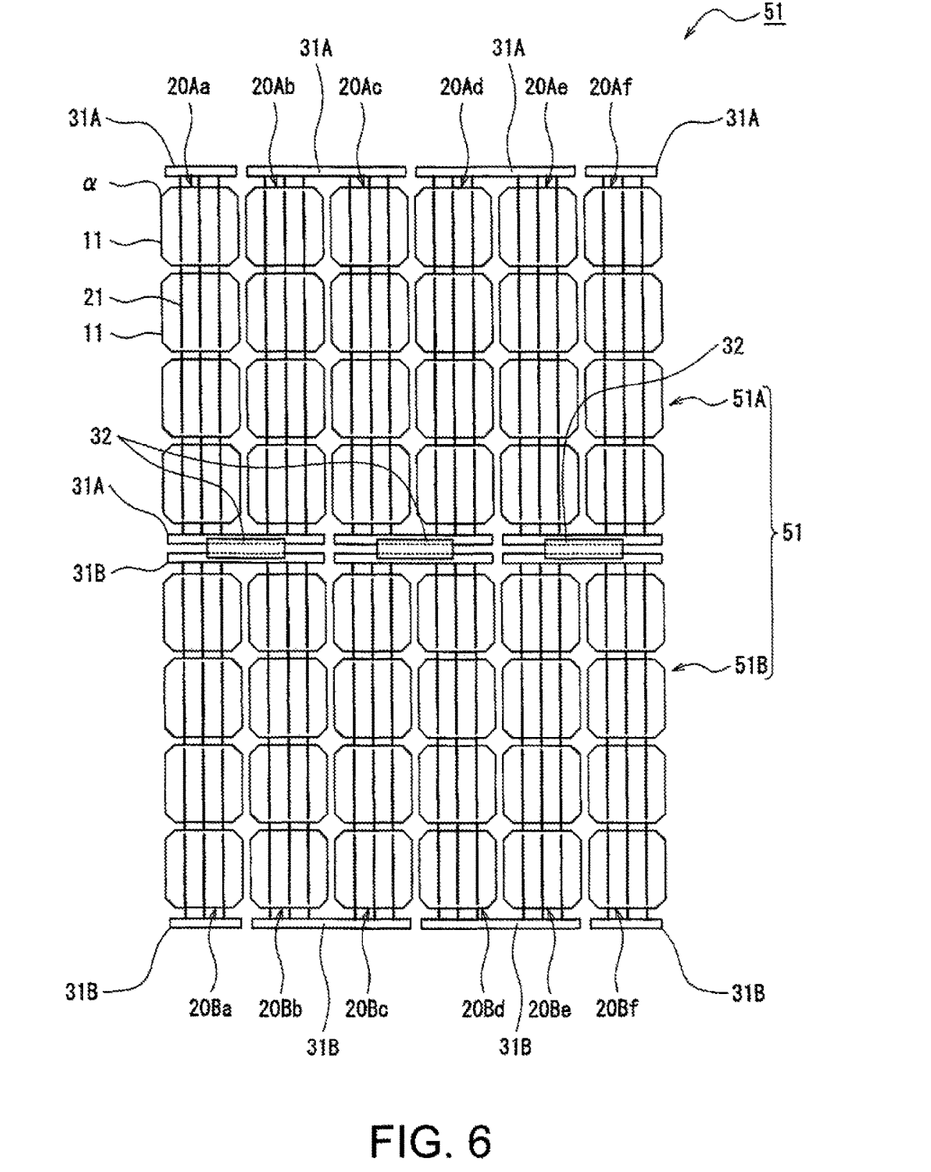
FIG. 6 is a diagram for explaining a method of manufacturing the solar cell module according to the second embodiment of the present disclosure.

FIG. 6 shows the group of strings 51 manufactured on a flat surface (before being placed over the substrate).

As shown in FIG. 6, similar to the case of the solar cell module 10, the group of strings 51 is desirably manufactured on a flat surface, and the strings 20 extend straight in the longitudinal direction before being placed over the first protection component 12. In the present embodiment, the second wiring members 31A and 31B placed adjacent to each other in the longitudinal direction between the blocks are fixed using the adhesion tape 32.

The group of strings 51 to which the adhesion tape 32 is adhered is placed over the first protection component 12, and is laminated with the constituting members, so that the solar cell module 50 having the above-described structure is obtained. In the case of the present embodiment, when the group of strings 51 is placed over the first protection component 12, the strings 20 positioned on the sides of the group of strings 51 in the lateral direction are placed along the curved surface of the first protection component 12, and the central portion of the group of strings 51 in the longitudinal direction protrudes on the sides in the lateral direction. In this case, the solar cells 11 positioned near the ends of the rows of the strings 20 becomes easier to move toward the inner side, but, with the division of the group of strings 51, the effect of such a movement is suppressed, and contact of the solar cells 11 can be prevented.

Third Embodiment

A solar cell module 70 according to a third embodiment of the present disclosure will now be described in detail with reference to FIG. 7. In the following, constituent elements similar to those of the above-described embodiments will be assigned the same reference numerals and will not be repeatedly described.

Figure 7:
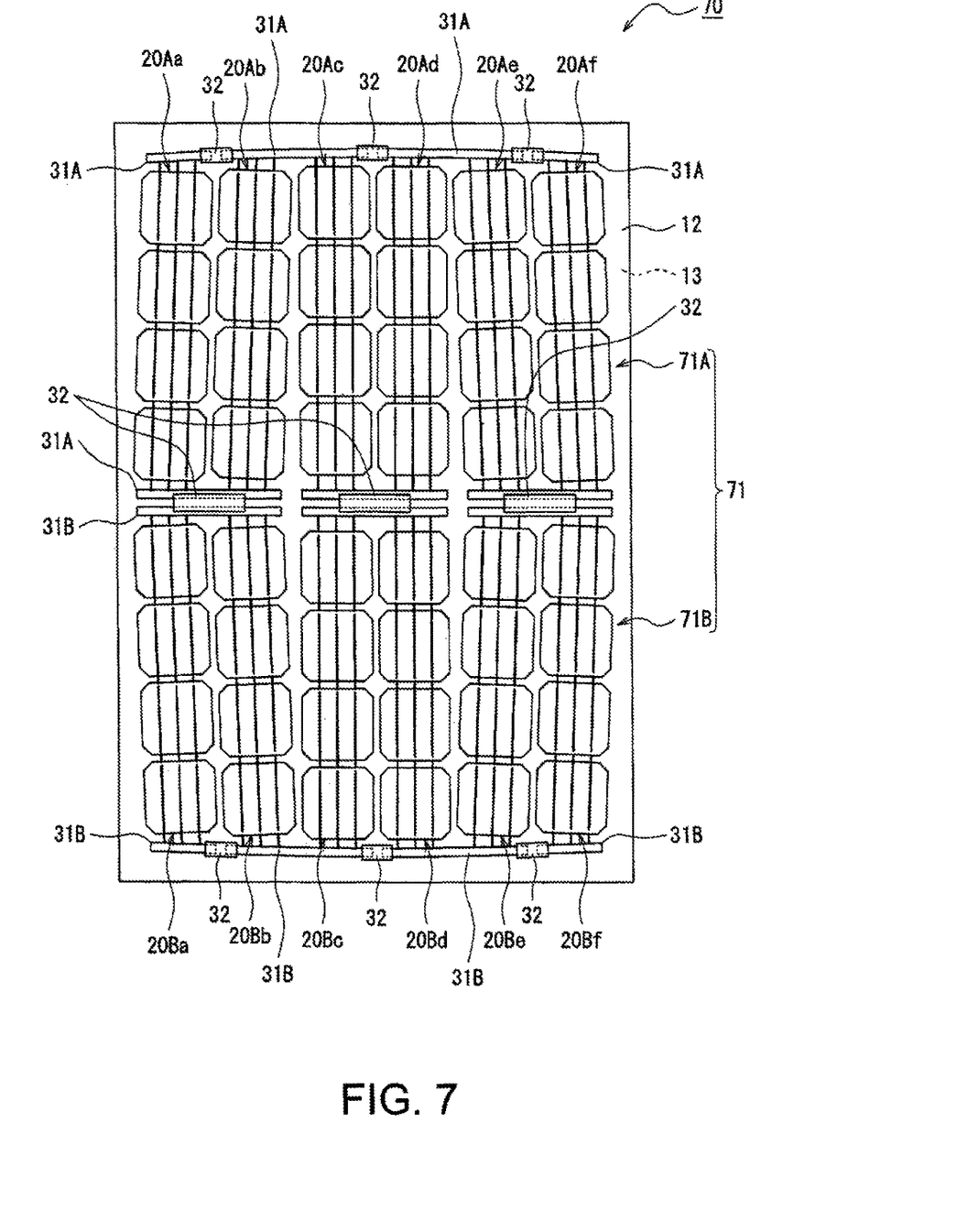
FIG. 7 is a plan view of a solar cell module according to a third embodiment of the present disclosure, viewed from the light receiving surface side.

FIG. 7 is a plan view of the solar cell module 70 viewed from a light receiving surface side.

As shown in FIG. 7, the solar cell module 70 differs from the solar cell modules 10 and 50 in that the second wiring members 31A placed adjacent to each other in the lateral direction are fixed, the second wiring members 31B placed adjacent to each other in the lateral direction are fixed, and the second wiring members 31A and 31B placed adjacent to each other in the longitudinal direction are fixed to each other. In this case also, the second wiring members 31 are desirably fixed using the adhesion tape 32.

In the solar cell module 70, for example, a length of a group of strings 71 in the longitudinal direction becomes longer from the ends in the lateral direction toward the central portion in the lateral direction, and a length in the lateral direction becomes longer from the ends in the longitudinal direction toward a boundary position between blocks 71A and 71B. In other words, in the group of strings 71, the central portion in the lateral direction protrudes to sides in the longitudinal direction and the central portion in the longitudinal direction protrudes to the side in the lateral direction. The degree of protrusion, however, is smaller compared to the cases of, for example, the groups of strings 30 and 50.

In the solar cell module 70 also, the group of strings 71 is desirably manufactured on a flat surface, and before being placed over the first protection component 12, the second wiring members 31A and 31B extend straight in the lateral direction and the strings 20 extend straight in the longitudinal direction. In the present embodiment, the second wiring members 31A placed adjacent to each other in the lateral direction are fixed to each other, the second wiring members 31B placed adjacent to each other in the lateral direction are fixed to each other, and the second wiring members 31A and 31B placed adjacent to each other in the longitudinal direction between the blocks are fixed to each other, respectively, using the adhesion tape 32. The group of strings 71 to which the adhesive tapes 32 are adhered is placed over the first protection component 12 and is laminated with the constituent members, to obtain the solar cell module 70 having the above-described structure.

When the group of strings 71 is placed over the first protection component 12, the second wiring member 31 fixed by the adhesion tape 32 is placed along the curved surface of the first protection component 12, and the strings 20 positioned at the sides of the group of strings 71 in the lateral direction are also placed along the curved surface. For example, when the second wiring member 31 fixed by the adhesion tape 32 is placed along the curved surface of the first protection component 12, a force to move the strings 20 positioned on the sides of the group of strings 30 in the lateral direction toward the inner side would act. However, because the second wiring members 31A and 31B positioned adjacent to each other in the longitudinal direction are fixed by the adhesion tape 32, the strings 20 positioned at the sides of the group of strings 30 in the lateral direction do not move toward the inner side, and in fact, it can be expected that a force that pushes the string toward the outer side will act. With such a configuration, the solar cell module 70 can be obtained in which, in the group of strings 71, the central portion in the lateral direction protrudes on the sides in the longitudinal direction and the central portion in the longitudinal direction protrudes on the sides in the lateral direction.

In the above-described embodiments, a configuration is exemplified in which the numbers of solar cells of the strings are identical to each other, but alternatively, the numbers of solar cells in the strings may differ among blocks. Alternatively, the numbers of strings of the blocks may differ from each other.

REFERENCE SIGNS LIST 10, 50, 70 SOLAR CELL MODULE; 11 SOLAR CELL; 12 FIRST PROTECTION COMPONENT; 13 SECOND PROTECTION COMPONENT; 14 ENCAPSULANT; 20, 20Aa, 20Ab, 20Ac, 20Ad, 20Ae, 20Af, 20Ba, 20Bb, 20Bc, 20Bd, 20Be, 20Bf STRING; 21 FIRST WIRING MEMBER; 30, 51, 71 GROUP OF STRINGS; 30A, 30B, 51A, 51B, 71A, 71B BLOCK; 31, 31A, 31B SECOND WIRING MEMBER; 32 ADHESION TAPE.

The invention claimed is:

1. A solar cell module comprising:
a substrate which is curved in a longitudinal direction and in a lateral direction;
a plurality of strings aligned in the lateral direction;
the plurality of strings each comprising a plurality of solar cells and first wiring members that connect adjacent solar cells to each other in the longitudinal direction, the plurality of strings being placed over the substrate, aligned in the lateral direction; and
a group of the plurality of strings divided into at least two blocks aligned in the longitudinal direction;
the group of strings comprising
the plurality of the strings,
second wiring members that are placed on sides of the plurality of strings across the lateral direction and, the second wiring members are connected to the first wiring members so as to connect adjacent strings of the plurality of strings to each other in the lateral direction,
and third wiring members that are placed between the at least two blocks and are connected to the first wiring members so as to connect adjacent solar cells of said plurality of solar cells to each other in the lateral direction, and wherein
at least two of the third wiring members placed adjacent to each other in the longitudinal direction between the blocks are fixed to each other.

2. The solar cell module according to claim 1, wherein
a length of the group of strings in the longitudinal direction becomes longer from ends in the lateral direction toward a central portion in the lateral direction.

3. The solar cell module according to claim 2, wherein
a spacing between adjacent blocks is maximum at the central portion of the group of strings in the lateral direction.

4. The solar cell module according to claim 1,
a length of the groups of strings in the lateral direction becomes longer from ends in the longitudinal direction toward a boundary position of the blocks.

5. The solar cell module according to claim 1, wherein
the second wiring members placed adjacent to each other in the lateral direction or the third wiring members placed adjacent to each other in the longitudinal direction are fixed by an adhesion tape in the area the plurality of solar cells are not placed.

6. A method of manufacturing a solar cell module, comprising:
connecting adjacent solar cells to each other in a longitudinal direction by first wiring members to form a plurality of strings in each of which a plurality of the solar cells are arranged in one line;
placing second wiring members on sides of the plurality of string in the longitudinal direction and connecting the second wiring members to the first wiring members, to connect adjacent strings of the plurality of strings in a lateral direction to form a group of strings which is divided into at least two blocks aligned in the longitudinal direction; and
after fixing to each other at least two of the second wiring members of the string placed adjacent to each other in the lateral direction and at least two of the second wiring members placed adjacent to each other in the longitudinal direction between the blocks, placing the group of strings over a substrate which is curved in the longitudinal direction and in the lateral direction, or
after placing the group of the strings over the substrate which is curved in the longitudinal direction and in the lateral direction, fixing to each other at least two of the second wiring members of the strings placed adjacent to each other in the lateral direction and at least two of the second wiring members placed adjacent to each other in the longitudinal direction between the blocks,
placing third wiring members between the at least two blocks and connecting the third wiring members to the first wiring members so as to connect adjacent solar cells of said plurality of solar cells to each other in the lateral direction, and wherein
at least two of the third wiring members placed adjacent to each other in the longitudinal direction between the blocks are fixed to each other.

* * * * *